United States Patent [19]
Deyo et al.

[11] Patent Number: 5,297,007
[45] Date of Patent: Mar. 22, 1994

[54] E/M SHIELDED RF CIRCUIT BOARD

[75] Inventors: Charles C. Deyo, Rockledge; Thomas R. Wolters, Satellite Beach; Robert H. Oas, Melbourne, all of Fla.

[73] Assignee: Rockwell International Corporation, Seal Beach, Calif.

[21] Appl. No.: 585,333

[22] Filed: Sep. 19, 1990

[51] Int. Cl.[5] .............................................. H05K 9/00
[52] U.S. Cl. .................................. 361/707; 174/252; 174/35 R; 174/35 GC; 361/711; 361/712; 361/714; 361/760; 361/816; 361/818
[58] Field of Search ................ 174/35 R, 35 C, 252; 361/387, 388, 424

[56] References Cited

U.S. PATENT DOCUMENTS

| | | | |
|---|---|---|---|
| 4,306,275 | 12/1981 | Miura | 174/252 |
| 4,370,515 | 1/1983 | Donaldson | 174/35 R |
| 4,385,202 | 5/1983 | Spinelli et al. | 361/388 |
| 4,472,762 | 9/1984 | Spinelli et al. | 174/252 |
| 4,612,566 | 9/1986 | Kowata et al. | 361/388 |
| 4,675,784 | 6/1987 | Dahlberg et al. | 361/387 |
| 4,771,294 | 9/1988 | Wasilovsky | 361/388 |
| 4,993,148 | 2/1991 | Adachi et al. | 174/252 |
| 5,006,667 | 4/1991 | Lonka | 361/424 |

FOREIGN PATENT DOCUMENTS

| | | | |
|---|---|---|---|
| 0239916 | 10/1986 | Fed. Rep. of Germany | 174/35 R |
| 0239917 | 10/1986 | Fed. Rep. of Germany | 174/35 R |

OTHER PUBLICATIONS

IBM Disclosure Bulletin, "Heat Sink Assembly for TAB-Mounted Devices", vol. 31, No. 6, Nov. 1988.

*Primary Examiner*—Leo P. Picard
*Assistant Examiner*—Donald A. Sparks
*Attorney, Agent, or Firm*—Gregory G. Williams; M. Lee Murray; H. Fredrick Hamann

[57] ABSTRACT

An improved circuit board having a variety of electronic components mounted thereon and having disposed to the autumn side of the circuit board a backing plate having a variety of thicknesses wherein a thicker portion of the backing plate is disposed near portions of the circuit board or components on the circuit board which are of a higher heat generating nature, the circuit board further having a slot extending through the circuit board and inserted in the slot is a metallic shielding cover which contacts the backing plate. Also disclosed is a method for manufacturing the circuit board.

2 Claims, 2 Drawing Sheets

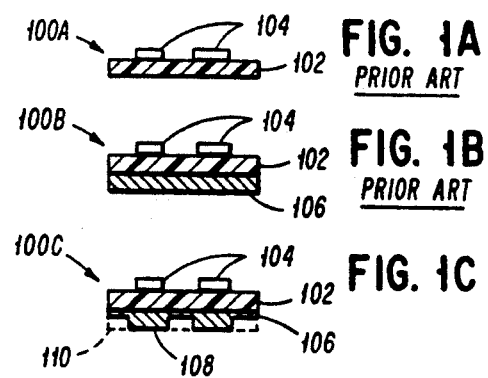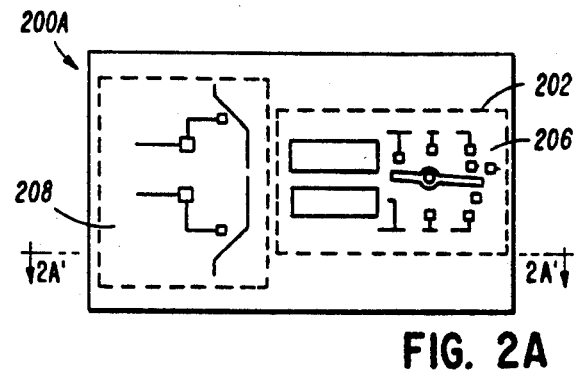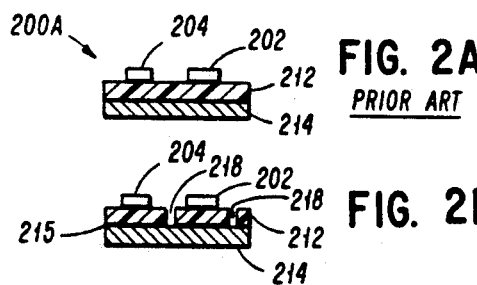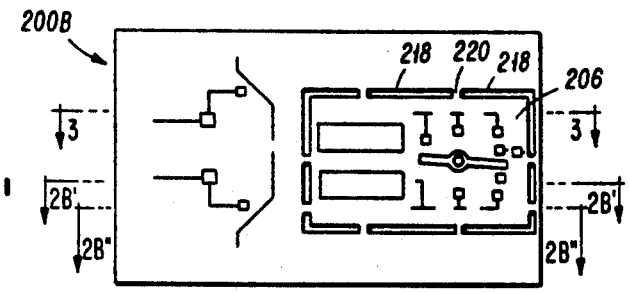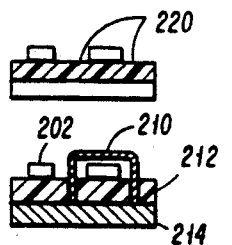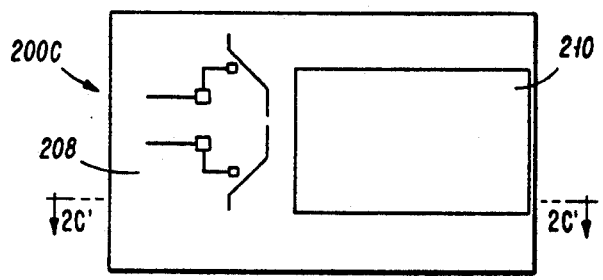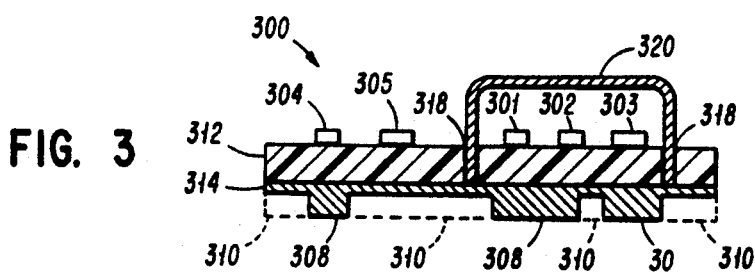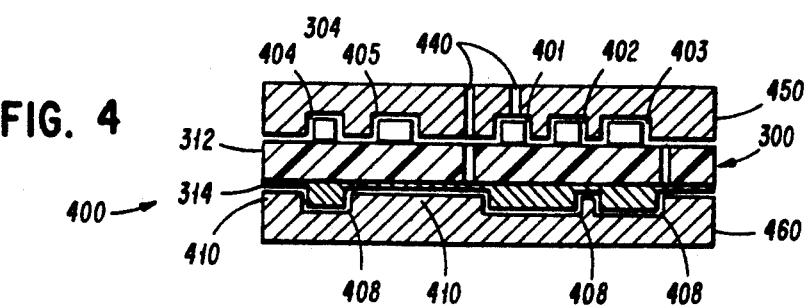

E/M SHIELDED RF CIRCUIT BOARD

CROSS REFERENCE TO RELATED APPLICATION

This application relates to the subject matter of co-pending application entitled "Method of Manufacturing An E/M Shielded RF Circuit Board" filed on the same date herewith by the same inventors.

FIELD OF THE INVENTION

This invention generally relates to circuit boards and methods of their manufacture, and more particularly concerns circuit boards having RF circuits thereon and even more particularly relates to a high yield method for manufacturing RF circuit boards which require E/M shielding of various sections and further requiring heat dissipating abilities for certain components on the circuit board and further requiring special mounting provisions for certain components on the circuit board.

BACKGROUND OF THE INVENTION

In the past, it has been proposed that heat dissipating properties for circuit boards be increased by affixing a thick metal plate or heat sink to the back of the printed circuit board. While this method has enjoyed much use in the past, it does have serious drawbacks. Since the metal plate is capable of absorbing heat from the components during normal operation of the circuit board, the metal plate is also capable of absorbing heat during any soldering process and thereby requiring an increased amount of time that the circuit board and plate combination is in a soldering machine which is known to be undesirable.

Also in the past, it has been proposed to provide for E/M shielding of various sections of a circuit board by placing a conductive cover on top of the circuit board over the area to be shielded. While this method of E/M shielding has received extensive use in the past, it too has serious drawbacks. Frequently the degree of E/M shielding is not sufficient for some purposes and consequently the performance of the circuit is degraded.

Also in the past it has been proposed to use a fixture device having several protuberances thereon for applying pressure to selective areas on a printed circuit board during the vapor phase soldering process. While this method has been used in the past, it too does have some drawbacks. The several protuberances often fail to provide an even distribution of pressure across the circuit board allowing for areas where the soldering process fails to be optimal.

Consequently, there exists a need for improving RF circuit boards and their method of manufacture.

SUMMARY OF THE INVENTION

It is an object of the present invention to provide a high yield method for manufacturing circuit boards.

It is a feature of the present invention to provide for selective removal of matter from the backing plate heat sink.

It is an advantage of the present invention to reduce the thermal mass of the backing plate heat sink in areas where dissipation of heat generated by components of the circuit board is unnecessary and consequently allowing for an overall reduction of the amount of time the circuit board and backing plate are exposed to elevated temperatures in vapor phase or infrared soldering machines.

It is another object of the present invention to provide improved circuit board performance.

It is another feature of the present invention to provide a conductive cover extending over the section of the circuit board to be shielded and further extending through voids in the circuit board and contacting the metallic backing plate heat sink.

It is another advantage of the present invention to reduce E/M interference between selected sections of the circuit board.

It is yet another object of the present invention to manufacture a circuit board with improved bonding between the circuit board and the backing plate.

It is yet another feature of the present invention to utilize a fixture in clamping together the circuit board and backing plate where the fixture is a mirror image image of the circuit on the circuit board.

It is yet another advantage of the present invention to allow for evenly distributed pressure across the circuit board during times of clamping and vapor phase or infrared soldering.

The present invention provides a circuit board and method of manufacture which is designed to satisfy the aforementioned needs, produce the earlier mentioned objects, contain the above-described features and achieve the previously stated advantages. The invention is carried out in a "non-excessive heat exposure" method and a "non-E/M interference" method in the sense that the time the circuit board is exposed to heat in a vapor phase or infrared soldering machine is reduced and the amount of E/M interference for selected portions of the circuit board is reduced.

Accordingly, the present invention relates to printed circuit boards and methods of manufacture where the circuit board contains a backing plate having portions thereof selectively removed for reducing thermal mass and further containing a conductive cover over selective sections of the circuit board which extends through voids in the circuit board to form a line of continuous connection with the backing plate.

BRIEF DESCRIPTION OF THE DRAWINGS

The invention may be more fully understood by reading the following detailed description in conjunction with the appended drawings wherein:

FIG. 1A is a cross sectional diagram of a printed circuit board of the prior art.

FIG. 1B is a cross sectional diagram of a printed circuit board of the prior art having a metallic backing plate.

FIG. 1C is a cross sectional representation of a printed circuit board of the present invention having a metallic backing plate with portions thereof removed.

FIG. 2A is a schematic representation of a top view of a printed circuit board of the prior art.

FIG. 2A' is a cross sectional view of the printed circuit board of FIG. 2A taken on line 2A'—2A'.

FIG. 2B is a top view of a printed circuit board of the present invention showing a plurality of slots 218 therein.

FIG. 2B' is a cross sectional representation of a printed circuit board of the present invention taken along line 2B'—2B' of FIG. 2B.

FIG. 2B" is a cross sectional representation of a printed circuit board of the present invention taken on line 2B"—2B" of FIG. 2B.

FIG. 2C is a top view of a printed circuit board of the present invention including a shielding cover 210 placed thereon.

FIG. 2C' is a cross sectional representation of the printed circuit board of the present invention taken along lines 2C'—2C' of FIG. 2C which shows a cross sectional representation of a shielding cover 210.

FIG. 3 is a cross sectional representation of a printed circuit board of the present invention, taken on line 3—3 of FIG. 2B, showing slots 318 extending through the circuit board and areas 310 wherein metal from the backing plate has been removed.

FIG. 4 is a cross sectional representation of the printed board of the present invention in position between a mirror image fixture device used in the method of the present invention to manufacture the printed circuit board.

DETAILED DESCRIPTION

Figure 5:
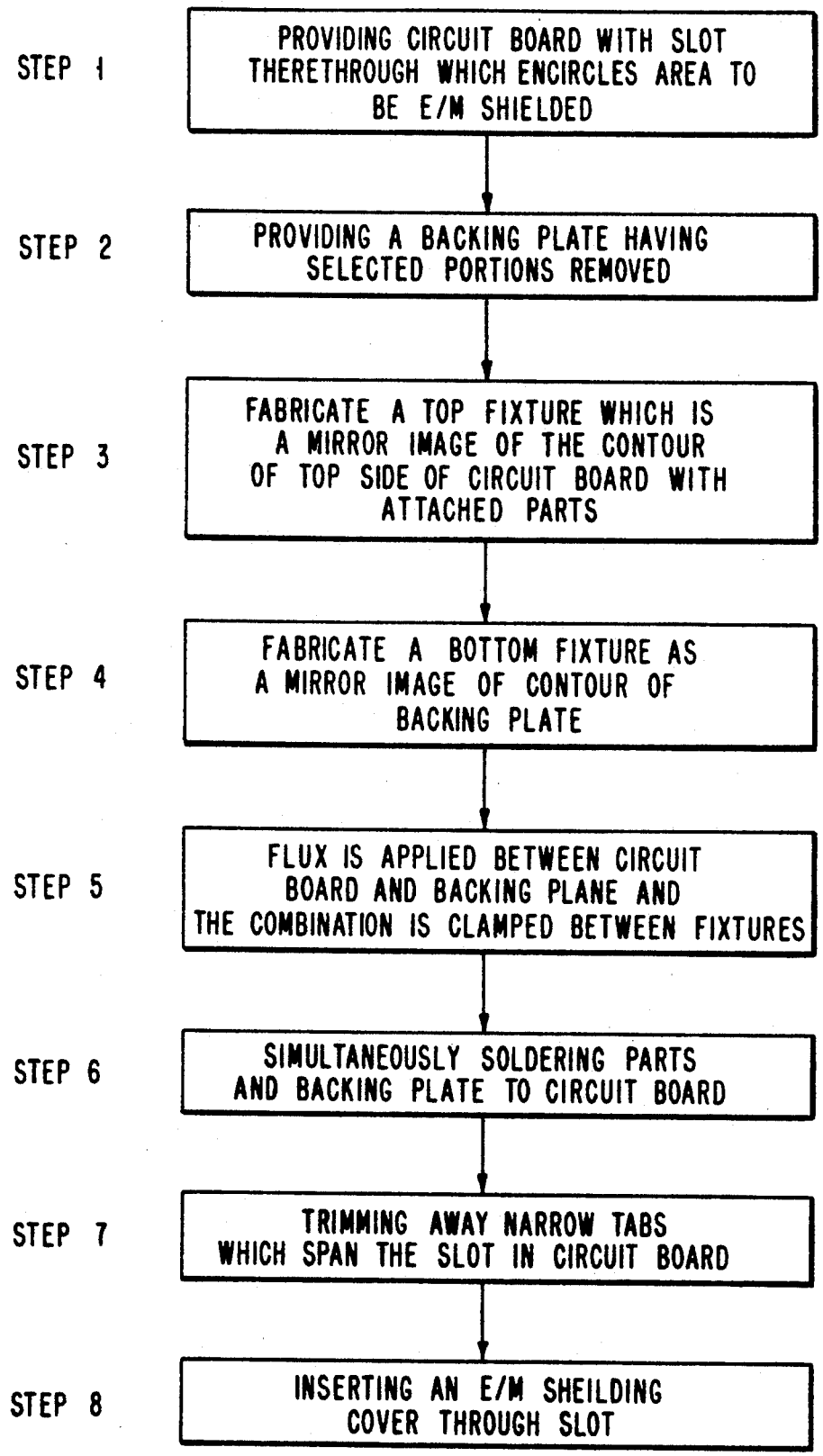
FIG. 5 is a flow diagram of the steps of the method of the present invention to manufacture the circuit boards of the present invention.

Now referring to FIG. 1A there is shown a printed circuit board generally designated 100A, of the prior art, showing a circuit board 102 having parts 104 thereon.

Now referring to FIG. 1B there is shown a printed circuit board, of the prior art, generally designated 100B having a printed circuit board 102 with parts 104 thereon and further having a metallic backing plate or backing plate 106 affixed thereto.

Now referring to FIG. 1C there is shown a cross sectional representation of a printed circuit board of the present invention, generally designated 100C, having a circuit board 102 with parts 104 disposed thereon and further having backing plate 106 affixed thereto wherein metal mass 110 has been removed so that backing plate 106 has protuberances 108 disposed thereon. Protuberances 108 are generally disposed beneath sections of the circuit board 102 which are of a higher heat generating nature or having components requiring thicker material for mounting.

Now referring to FIG. 2A there is shown a printed circuit board 200A, of the prior art, which is divided into a first section 202 and a second section 204. Section 202 includes a circuit generally designated 206 which may be a circuit of any configuration wherein the circuit includes some areas of higher relatively heat generating capacities. Furthermore, circuit 206 is shown inside area 202 and is chosen to represent that portion of a circuit which is desirably shielded from external E/M interference. Second section 204 of circuit board 200A includes a representative circuit 208 which is chosen to depict a circuit having therein some areas of relatively higher heat generating coverabilities and further chosen to represent an area not requiring shielding from external E/M interference.

Now referring to FIG. 2A' there is shown a cross sectional representation of the circuit board 200A of FIG. 2A further showing a metallic backing plate 214.

Now referring to FIG. 2B there is shown a circuit board of the present invention, generally designated 200B, which is similar in its circuit characteristics to circuit board 200A of FIG. 2A, but further having a slot 218 extending from the top side 213 (FIG. 2B') to the bottom side 215 (FIG. 2B') of circuit board 212. In order to tie the various sections of the circuit board 212 together and provide a reasonable degree of rigidity, several tabs 220 are provided across slots 218.

Now referring to the FIG. 2B' there is shown a cross sectional representation of the circuit board 200B of FIG. 2B which clearly shows the slots 218 extending from the top side 213 of circuit board 212 to the bottom side 215 of circuit board 212 thereby making connection with the backing plate 214.

Now referring to FIG. 2B'' there is shown a cross sectional representation of the circuit board 200B of FIG. 2B wherein the slots 218 (FIG. 2B') are spanned by tabs 220.

Now referring to FIG. 2C there is shown a printed circuit board of the present invention, generally designated 200C which shows a E/M shielding cover 210 disposed through the slots 218 of the circuit board 200B of FIG. 2B, after the tabs 220 have been trimmed away.

Now referring to FIG. 2C' there is shown a cross sectional representation of the circuit board 200C of FIG. 2C taking along line 2C'—2C' of FIG. 2C which clearly shows the E/M shield 210 extending from the backing plate 214 through the circuit board 212 over the part 202 and further extending back through the circuit board 212 to the backing plate 214.

Now referring to FIG. 3, there is shown a circuit board, of the present invention, generally designated 300 which is taken on line 3—3 of FIG. 2B wherein circuit board 300 contains circuit board 312 having slots 318 extending therethru and parts 304, 305, 301, 302 and 303 disposed thereon. Affixed to circuit board 312 is backing plate 314. Backing plate 314 is shown having plurality of sections 310 removed therefrom in order to produce a plurality of protuberances 308 which are disposed at predetermined positions so as to provide the necessary heat absorbing capabilities for those portions of the circuit board 300 which have a high heat generating capability. Also shown is shielding cup 320, which is shown disposed in slots 318 and covering parts 301, 302, and 303.

Now referring to FIG. 4 there is shown a combination of a top fixture 450, a bottom fixture of 460 and the printed circuit board 300 of FIG. 3. Top fixture of 450 having a series of indentations 404, 405, 401, 402 and 403 for receiving parts 304, 305, 301, 302, 303 respectively. Also shown extending through fixture 450 is a plurality of venting holes 440. Bottom fixture 460 is shown having a plurality of cutouts 408 for receiving the protuberances 308 of circuit board 300. In general the top fixture 450 and the bottom fixture 460 are mirror images of the contours of circuit board 312, with attached parts, and backing plate 314 with its protuberances thereon.

In operation, the circuit board 300 (FIG. 3) has much improved characteristics in that it provides for E/M shielding of certain parts and also provides for heat absorbing capabilities at predetermined positions on the circuit board without unnecessarily increasing the overall thermal mass of the circuit board.

Now referring to FIG. 5, there is shown a flow diagram of the method, of the present invention, for manufacturing the circuit boards, of the present invention.

Step 1 involves providing a printed circuit board having a groove or slot extending through the circuit board, for later receiving a E/M shielding cap. The groove having narrow tabs spanning the groove in order to tie the sections of the circuit board together. The underside of the narrow tabs are not plated in order to prohibit soldering of the tabs to the backing plate. The circuit board is preferably fashioned with numerous vent holes extending therethru which would allow gasses to escape in order to minimize voids between the plate and circuit board during a later soldering process. The circuit components or parts are mounted but not soldered to the printed board at predetermined locations thereon.

Step 2. A backing plate, for later attachment to the circuit board, is fabricated with portions of it being removed so that a areas backing plate will be disposed near portions of the circuit board with a higher heat generating nature. This removal of portions of the backing plate may be performed by an etching process, a mechanical milling process, or casting process. The backing plate is preferably fabricated so that a very thin backing plate will be disposed under those portions of the circuit board with a relatively low heat generating nature and similarly a thicker cross section of the backing plate will be disposed near portions of the circuit board which are relatively higher heat generating in nature. This removal of the thermal mass provides for a reduction of the overall thermal mass of the circuit board and backing plate combination while still providing the necessary thermal mass at the most critical points on the circuit board such as areas having power transistors, impatt diodes or other components of a relatively high heat generating nature. The reduced thermal mass of the backing plate allows the plate to rise to the soldering temperature more quickly, thus minimizing component exposure to the heat. This also reduces the amount of cooling time required because the thinner portion of the backing plate does not retain the heat as long.

Step 3 is to fabricate a top fixture which is a mirror image of the contour of the top side of the circuit board with its components or parts mounted thereon. Clearances are provided in the top fixture so that it will not interfere with the components or circuit traces when the clamping and soldering later occurs.

Step 4 is fabricating the bottom fixture as a mirror image of the contour of the backing plate after portions of it have been removed.

In Step 5 flux is applied between the circuit board and the backing plate then the combination is clamped between the top and bottom fixture.

Step 6 involves the parts and the backing plate being simultaneously soldered to the circuit board in a vapor phase chamber, infrared oven or similar soldering device.

Step 7 involves trimming the tabs which span the groove in the circuit board away after the circuit board has been removed from the fixtures.

Step 8 involves inserting an E/M shielding cover over the predetermined portion of the circuit board where portions of the shielding cover extend through the groove in the circuit board and contact the backing plate. The shielding cover is then clamped into position.

It is thought that the circuit board and method of manufacture, of the present invention and many of their attendant advantages will be understood from the foregoing description, and it will be apparent that various changes may be made in the form, construction, and arrangement of the parts thereof without departing from the spirit in scope of the invention, or sacrificing all of their material advantages, the forms herein before described being merely preferred or exemplary in bodiments thereof.

We claim:

1. A circuit board of the type having portions thereon with a higher heat generating nature with respect to other portions of the board and further having portions thereon with a higher degree of need for E/M shielding with respect to other portions of the board; the circuit board comprising:
   (a) a printed circuit board having a plurality of electronic components mounted thereon;
   (b) said printed circuit board further having a slot extending therethru, said slot completely encircling a portion of the printed circuit board having a relatively higher degree of need for E/M shielding;
   (c) a backing plate soldered to said printed circuit board, said backing plate having various thickness, wherein the thickness is predetermined in relation to predetermined characteristics for particular components of corresponding portions of the printed circuit board,
   said predetermined characteristics are predetermined mounting requirements for said particular component; and,
   (d) a metallic E/M shielding cover disposed over a portion of the printed circuit board and extending through said slot in the printed circuit board; said shielding cover further contacting said backing plate;
   WHEREBY, an improved circuit board having enhanced E/M shielding characteristics and hear dissipating characteristics is provided.

2. A circuit board comprising:
   a printed circuit board having a plurality of electronic components mounted thereon, said plurality of electronic components including at least one hot electronic component having a relatively higher heat generating nature with respect to the remainder of said plurality;
   said hot electronic component being disposed at a first circuit board position on said circuit board;
   said plurality of electronic components further including at least one first electronic component having predetermined mounting requirements, said first electronic component being located at a second circuit board position on said board;
   a backing plate, soldered to said circuit board;
   said backing plate having a first backing plate position wherein the relative thickness of said back plate at said first back plate position is thicker with respect to other positions on said backing plate;
   said backing plate having a second plate position wherein the relative thickness of said backing plate at said second backing plate position is thicker with respect to other positions of said backing plate;
   said backing plate being soldered to said circuit board so that said first circuit board position is in vertical alignment with said first backing plate position and said second circuit board position is in vertical alignment with said second backing plate position;
   said circuit board having a slot therein which encircles an area of said circuit board having a higher degree of need for E/M shielding with respect to other areas of said circuit board;
   said slot extending through said circuit board and thereby exposing said backing plane; and
   an E/M shielding cover disposed through said slot and contacting said backing plate.

* * * * *